(12) United States Patent
Kuwahara et al.

(10) Patent No.: US 7,766,661 B2
(45) Date of Patent: Aug. 3, 2010

(54) HEAT TRANSFER MEMBER AND CONNECTOR

(75) Inventors: Akira Kuwahara, Tokyo (JP); Takuya Takahashi, Tokyo (JP); Seiya Takahashi, Tokyo (JP); Hiroshi Akimoto, Tokyo (JP); Hiroshi Endo, Tokyo (JP); Yoshiaki Ishiyama, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 0 days.

(21) Appl. No.: 12/211,300

(22) Filed: Sep. 16, 2008

(65) Prior Publication Data

US 2009/0075515 A1   Mar. 19, 2009

(30) Foreign Application Priority Data

Sep. 18, 2007  (JP)  ............... 2007-240503

(51) Int. Cl.
*H01R 9/09*  (2006.01)
(52) U.S. Cl. ............ 439/56; 361/709; 361/712; 439/68; 439/71; 439/487
(58) Field of Classification Search ............ 439/91, 439/487, 56, 71, 68; 361/704, 705, 718, 361/719, 709, 712; 165/185; 257/712, 713, 257/714

See application file for complete search history.

(56) References Cited

U.S. PATENT DOCUMENTS

| 3,885,173 | A | * | 5/1975 | Lee | 310/313 B |
| 3,991,463 | A | * | 11/1976 | Squitieri et al. | 29/883 |
| 4,092,697 | A | * | 5/1978 | Spaight | 361/718 |
| 4,602,314 | A | * | 7/1986 | Broadbent | 361/719 |
| 4,859,189 | A | * | 8/1989 | Petersen et al. | 439/66 |
| 5,273,439 | A | * | 12/1993 | Szerlip et al. | 439/66 |
| 6,410,857 | B1 | * | 6/2002 | Gonya | 174/254 |
| 7,553,162 | B2 | * | 6/2009 | Isoda et al. | 439/56 |

FOREIGN PATENT DOCUMENTS

JP   2006-331801 A   12/2006

\* cited by examiner

*Primary Examiner*—Neil Abrams
(74) *Attorney, Agent, or Firm*—Frishauf, Holtz, Goodman & Chick, P.C.

(57) ABSTRACT

A heat transfer member which is capable of enhancing efficiency of heat dissipation, and a connector including the heat transfer member. On the surface of an elastic body arranged between an LED and a heat sink, a heat conduction metal thin film that transfers heat generated in the LED to the heat sink is formed. The member may also include an electrical conduction metal film, whereby the member may serve as both a heat transfer member and as an electrical connector.

1 Claim, 9 Drawing Sheets

HEAT TRANSFER MEMBER AND CONNECTOR

BACKGROUND OF THE INVENTION

1. Field of the Invention

This invention relates to a heat transfer member and a connector including the heat transfer member.

2. Description of the Related Art

Conventionally, there has been proposed a heat transfer member which transfers heat generated in electronic components to a heat dissipation member (see Japanese Laid-Open Patent Publication (Kokai) No. 2006-331801).

The heat transfer member includes a type made of metal and a type made of resin.

The heat transfer member made of metal is a spring bent into a substantially L-shape. One end of the spring is brought into contact with an electronic component, and the other end is brought into contact with a heat dissipation member.

The heat transfer member made of resin is an elastic sheet.

Heat generated in the electronic component is transferred to the heat dissipation member via the L-shaped spring or the elastic sheet.

However, since the elastic sheet is made of resin, heat conductivity is low, and therefore, efficiency of heat dissipation is low.

Further, the L-shaped spring has a problem that heat conductivity is low, due to small contact areas in contact with the electronic component and the heat dissipation member.

SUMMARY OF THE INVENTION

The present invention has been made in view of these circumstances, and an object thereof is to provide a heat transfer member which is capable of enhancing efficiency of heat dissipation, and a connector including the heat transfer member.

To attain the above object, in a first aspect of the present invention, there is provided a heat transfer member comprising an elastic body that is disposed between an electronic component and a heat dissipation member, and a heat conduction metal film that is formed on the elastic body, for transferring heat generated in the electronic component to the heat dissipation member.

With the arrangement of the heat transfer member according to the first aspect of the present invention, the heat transfer member comprises the elastic body and the heat conduction metal thin film. Therefore, when the heat transfer member is sandwiched between the electronic component and the heat dissipation member, the heat conduction metal film is brought into close contact with the electronic component and the heat dissipation member by the elastic force of the elastic body, whereby the heat generated in the electronic component is transferred to the heat dissipation member via the heat conduction metal film.

According to the first aspect of the present invention, it is possible to enhance efficiency of heat dissipation.

Preferably, the heat dissipation member comprises a heat sink.

Preferably, the heat dissipation member comprises a metal case that accommodates the electronic component.

Preferably, the heat dissipation member comprises an electrically conductive pattern for heat dissipation.

To attain the above object, in a second aspect of the present invention, there is provided a connector comprising a heat transfer member including an elastic body that is disposed between an electronic component and a heat dissipation member, and a heat conduction metal film that is formed on the elastic body, for transferring heat generated in the electronic component to the heat dissipation member, and an electric conduction metal film that electrically connects a terminal section of the electronic component and a pad of a substrate.

According to the second aspect of the present invention, it is possible to obtain the same advantageous effects as provided by the first aspect of the present invention.

Preferably, the heat dissipation member comprises a heat sink.

Preferably, the heat dissipation member comprises a metal case that accommodates the electronic component.

Preferably, the heat dissipation member comprises an electrically conductive pattern for heat dissipation.

The above and other objects, features and advantages of the present invention will become more apparent from the following detailed description taken in conjunction with the accompanying drawings.

DETAILED DESCRIPTION OF THE PREFERRED EMBODIMENT

The present invention will now be described in detail with reference to the drawings showing preferred embodiments thereof.

Figure 1A:
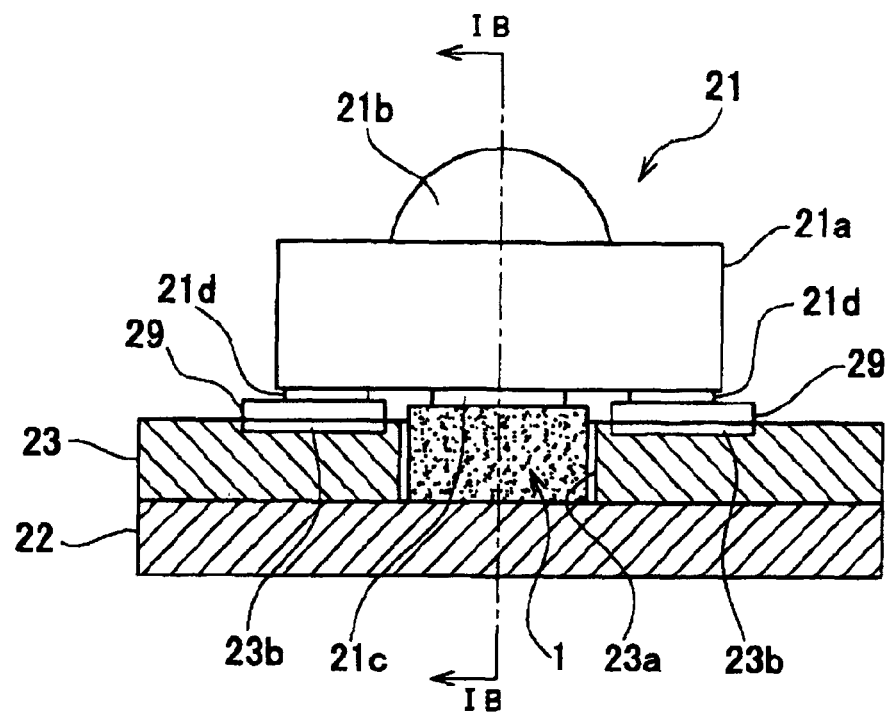
FIG. 1A is a cross-sectional view, taken on line IA-IA of FIG. 1B, of a heat transfer member according to a first embodiment of the present invention in a state of use.
Figure 1B:
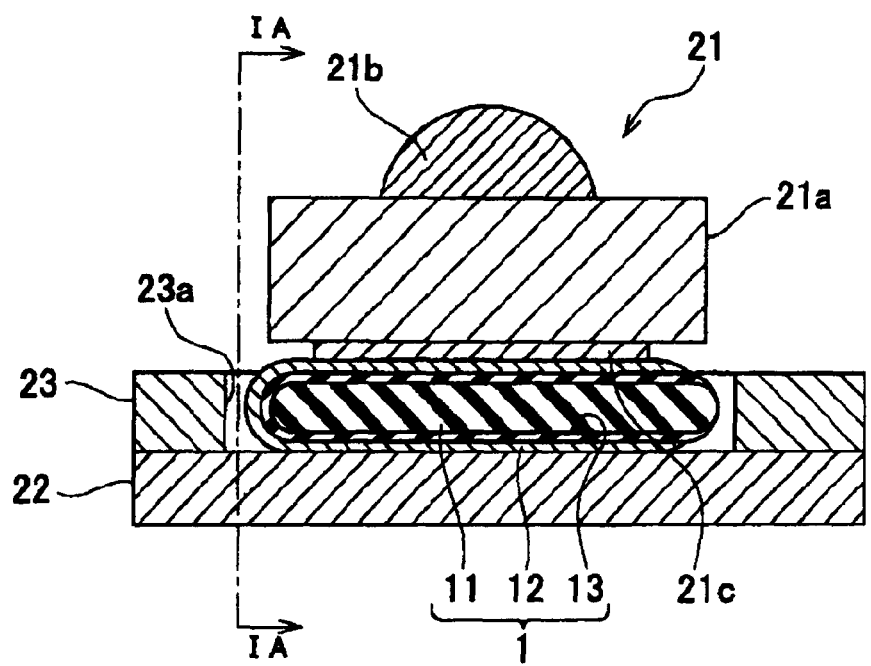
FIG. 1B is a cross-sectional view taken on line IB-IB of FIG. 1A.

FIG. 1A is a cross-sectional view, taken on line IA-IA of FIG. 1B, of a heat transfer member according to a first embodiment of the present invention in a state of use. FIG. 1B is a cross-sectional view taken on line IB-IB of FIG. 1A.

As shown in FIGS. 1A and 1B, a heat transfer member 1 is disposed between an LED (electronic component) 21 and a heat sink (heat dissipation member) 22.

The LED (light-emitting diode) 21 includes an LED body 21a and a light emitting section 21b. The bottom of the LED body 21a has a central part thereof formed with a heat dissipating section 21c. Terminal sections 21d are formed on opposite sides of the bottom surface of the LED body 21a, respectively.

The LED 21 is mounted on a circuit board (substrate) 23. The circuit board 23 has a through hole 23a formed therethrough. The through hole 23a is opposed to the heat dissipating section 21c of the LED 21 mounted on the circuit board 23. Further, two pads 23b are formed on the upper surface of the circuit board 23. The pads 23b are disposed in the vicinity of the through hole 23a. The terminal sections 21d are fixed to the pads 23b, respectively, by solder 29.

The heat sink 22 includes numerous fins (not shown) for heat dissipation, and is made of a material having high heat conductivity (e.g., aluminum).

As shown in FIG. 1B, the heat sink 22 is fixed by an appropriate fixing means, not shown, such as a bolt and nut.

The heat transfer member 1 includes an elastic body 11, a heat conduction metal thin film 12, and a film 13.

The elastic body 11 is substantially plate-shaped. The elastic body 11 is accommodated in the through hole 23a of the circuit board 23, and is disposed between the LED 21 and the heat sink 22. The elastic body 11 is sandwiched between the LED 21 and the heat sink 22, and is deformed elastically. Gum or gel is suitable for the material of the elastic body 11.

The film 13 is affixed to an upper surface to a lower surface of the elastic body 11. The heat conduction metal thin film 12 is formed on the film 13. The heat conduction metal thin film 12 has one end thereof in contact with the heat dissipating section 21c of the LED 21, and the other end thereof in contact with the heat sink 22.

The heat conduction metal thin film 12 is formed on the surface of the film 13 by a method of sputtering, vapor deposition, or plating. Au or the like is suitable for the material of the heat conduction metal thin film 12.

The film 13 is made of a material having insulation properties.

Next, a description will be given of how the heat transfer member 1 is used.

To dispose the heat transfer member 1 between the LED 21 and the heat sink 22, the heat sink is fixed on the circuit board 23 by a fixing means, beforehand.

First, the heat transfer member 1 is inserted into the through hole 23a of the circuit board 23.

Next, the terminal section 21d of the LED 21 is fixed to the pad 23b of the circuit board 23 by the solder 29.

At this time, the elastic body 11 of the heat transfer member 1 is sandwiched between the LED 21 and the heat sink 22, and is compressed to be elastically deformed.

The heat conduction metal thin film 12 has one end and the other end thereof pressed against the LED 21 and the heat sink 22, respectively, by the elastic force of the elastic body 11, which makes it possible to secure a large contact area between the heat dissipating section 21c of the LED 21 and the heat conduction metal thin film 12, and also a large contact area between the heat sink 22 and the heat conduction metal thin film 12. Therefore, when the LED 21 generates heat, the heat is efficiently transferred from the LED 21 to the heat sink 22 via the heat conduction metal thin film 12.

According to the first embodiment, since the heat generated in the LED 21 is efficiently transferred to the heat sink 22, it is possible to obtain a high heat dissipation efficiency.

Figure 2A:
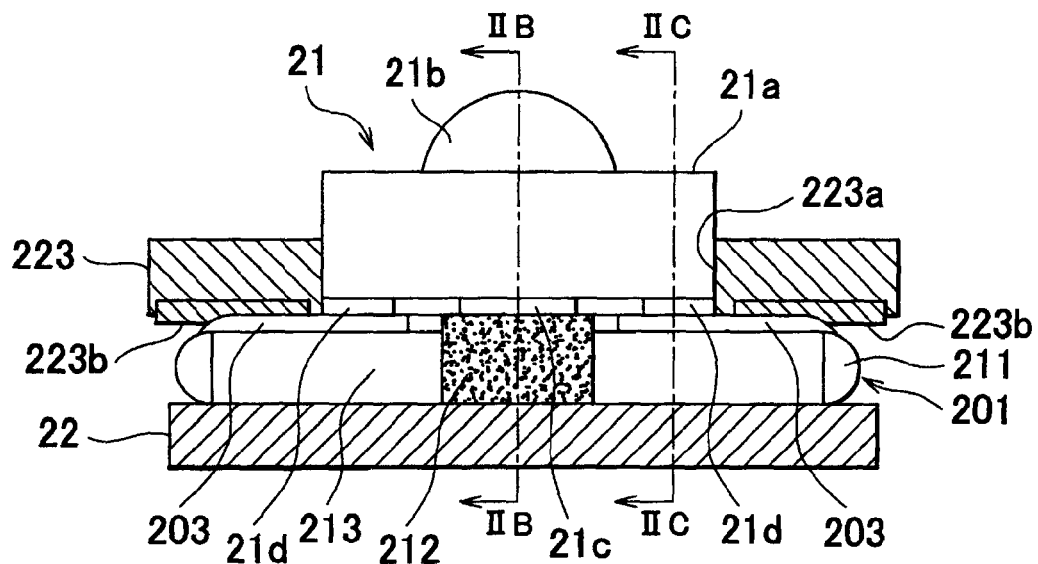
FIG. 2A is a cross-sectional view, taken on line IIA-IIA of FIG. 2B, of a heat transfer member according to a second embodiment of the present invention in a state of use.
Figure 2B:
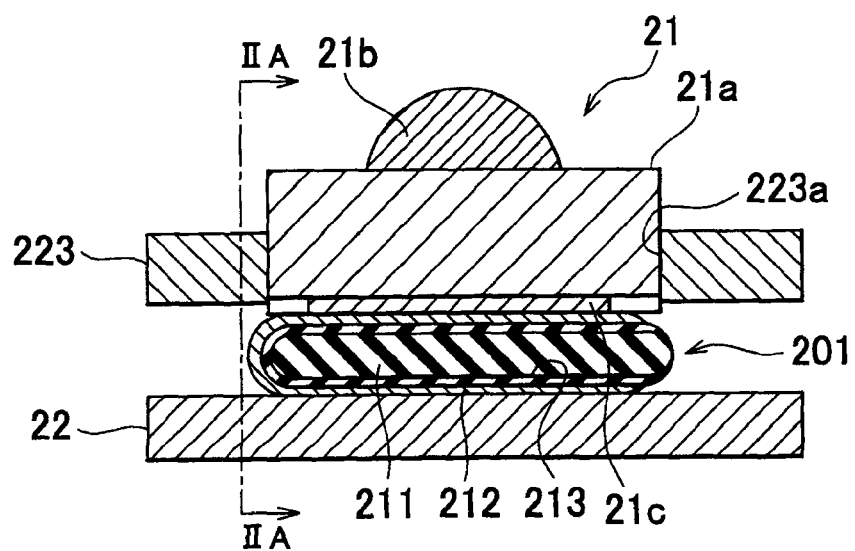
FIG. 2B is a cross-sectional view taken on line IIB-IIB of FIG. 2A.
Figure 2C:
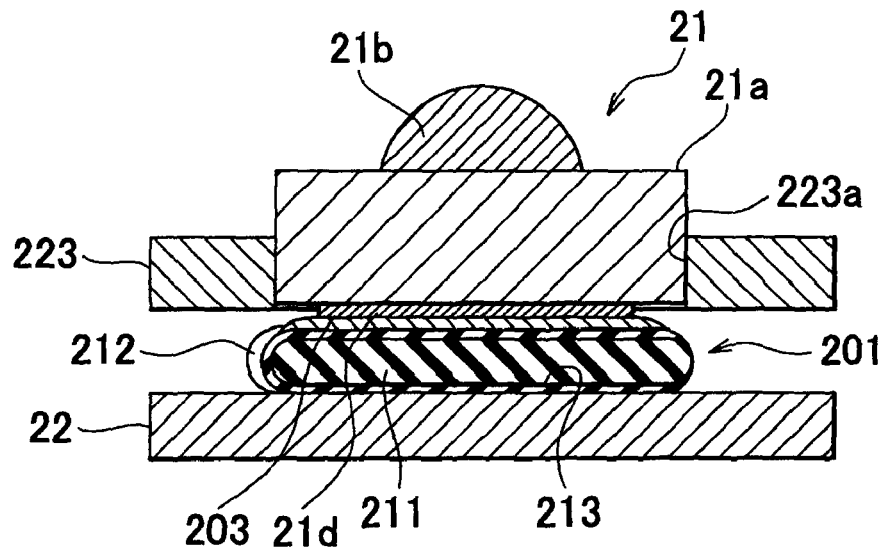
FIG. 2C is a cross-sectional view taken on line IIC-IIC of FIG. 2A.

FIG. 2A is a cross-sectional view, taken on line IIA-IIA of FIG. 2B, of a heat transfer member according to a second embodiment of the present invention in a state of use. FIG. 2B is a cross-sectional view taken on line IIB-IIB of FIG. 2A. FIG. 2C is a cross-sectional view taken on line IIC-IIC of FIG. 2A.

Component parts identical to those of the according to the first embodiment are designated by identical reference numerals, and detailed description thereof is omitted, while only main component parts different in construction from those of the first embodiment will be described hereinafter.

As distinct from the heat transfer member 1 of the first embodiment which has only a function of transferring the heat generated in the LED 21 to the heat sink 22, the heat transfer member 201 according to the second embodiment also has a function of electrically connecting the LED 21 and the circuit board 223, and hence serves both as a heat transfer member and a connector.

As shown in FIGS. 2A and 2B, the LED 21 is pressed into a through hole 223a of the circuit board (substrate) 223. The circuit board 223 has pads 223b formed on a lower surface thereof. The pads 223b are disposed in the vicinity of the through hole 223a.

The heat transfer member 201 includes an elastic body 211, a heat conduction metal thin film 212, a electric conduction metal thin film 203, and a film 213.

The elastic body 211 is substantially plate-shaped, and is larger than the LED 21.

The film 213 is affixed to an upper surface to a lower surface of the elastic body 211. The heat conduction metal thin film 212 is formed on the film 213.

On the film 213, two belt-shaped electric conduction metal thin films 203 (electric conduction metal films) are formed. The electric conduction metal thin films 203 are located on opposite sides of the heat conduction metal thin film 212 (see FIG. 2A). The two belt-shaped electric conduction metal thin films 203 are in contact with the associated terminal sections 21d of the LED 21 and the associated pads 223b of the circuit board 223, respectively, whereby the terminal sections 21d and the pads 223b respectively associated therewith are electrically connected.

Next, a description will be given of how the heat transfer member 201 is used.

To dispose the heat transfer member 201 between the LED 21 and the heat sink 22, the LED 21 is accommodated in the through hole 223a of the circuit board 223, beforehand.

First, the heat transfer member 201 is sandwiched between the LED 21 and the heat sink 22.

Next, the heat sink 22 is fixed on the circuit board 223 by a fixing means, not shown.

At this time, the elastic body 211 is sandwiched between the LED 21 and the heat sink 22, and is compressed to be elastically deformed.

Each electric conduction metal thin film 203 has one end and the other end thereof pressed against the associated terminal section 21d of the LED 21 and the associated pad 223b of the circuit board 223, respectively, by the elastic force of the elastic body 211. Further, the heat conduction metal thin film 212 has one end and the other end thereof pressed against the heat dissipating section 21c of the LED 21 and the heat sink 22, respectively.

As a result, the electric conduction metal thin film 203 electrically connects between the LED 21 and the circuit board 223 associated therewith, and the heat conduction metal thin film 212 transfers heat generated in the LED 21 to the heat sink 22.

According to the second embodiment, the same advantageous effects as provided by the first embodiment are obtained, and it is possible to electrically connect the LED 21 and the circuit board 223.

Figure 3A:
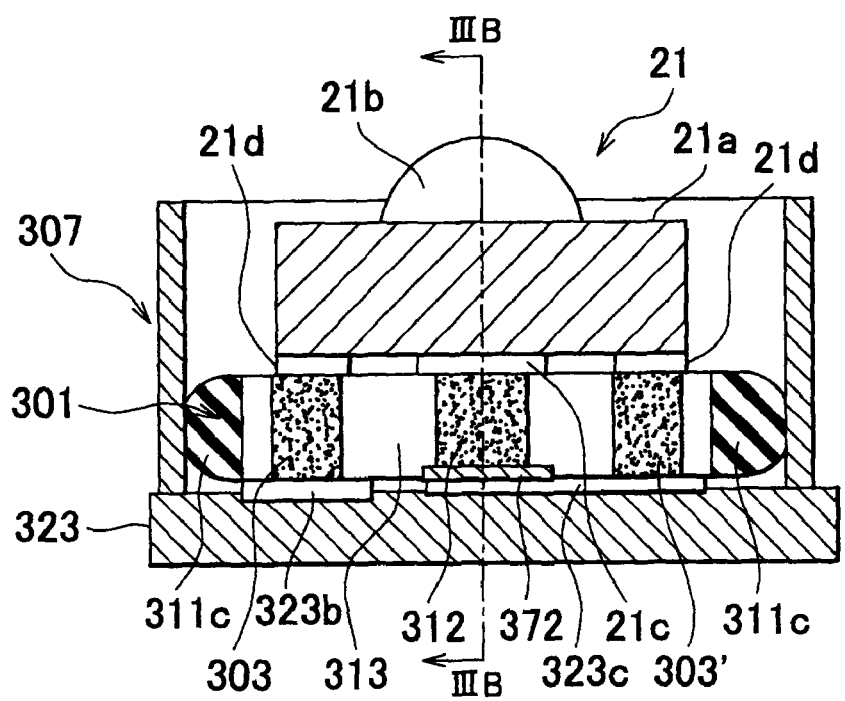
FIG. 3A is a cross-sectional view, taken on line IIIA-IIIA of FIG. 3B, of a heat transfer member according to a third embodiment of the present invention in a state of use.
Figure 3B:
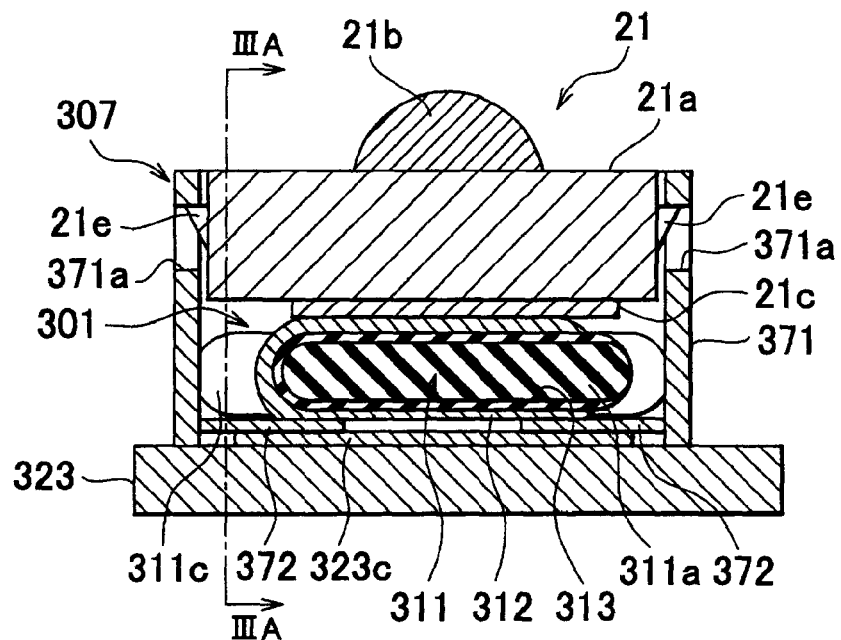
FIG. 3B is a cross-sectional view taken on line IIIB-IIIB of FIG. 3A.

FIG. 3A is a cross-sectional view, taken on line IIIA-IIIA of FIG. 3B, of a heat transfer member according to a third embodiment of the present invention in a state of use. FIG. 3B is a cross-sectional view taken on line IIIB-IIIB of FIG. 3A.

Component parts identical to those of the according to the first and second embodiments are designated by identical reference numerals, and detailed description thereof is omitted, while only main component parts different in construction from those of the second embodiment will be described hereinafter.

As distinct from the second embodiment which employs the arrangement for transferring heat generated in the LED 21 to the heat sink 22, the third embodiment employs the arrangement for transferring the heat generated in the LED 21 to a metal case (heat dissipation member) 307 and a pad 323c of a conductor pattern (heat dissipation member), not shown, on a circuit board (substrate) 323.

As shown in FIGS. 3A and 3B, locking lugs 21e are formed on opposite sides of the LED body 21a of the LED 21.

The circuit board 323 has pads 323b and 323c formed on an upper surface thereof. The conductor pattern on the circuit board 323 connected to the pad 323c extends to outside of the metal case 307 to serve as a heat dissipation member.

The metal case 307 includes a case body 371 and a fin 372 (see FIG. 3B). The case body is hollow prism-shaped, and has locking holes 371a formed in opposite sides thereof. The locking holes 371a receive the locking lugs 21a of the LED 21, whereby the LED 21 is held in the case body 371.

The fin 372 is connected to the case body 371. The fin 372 is in contact with one end of the pad 323c of the circuit board 323.

The heat transfer member 301 includes an elastic body 311, a heat conduction metal thin film 312, electric conduction metal thin films 303 and 303', and a film 313. The heat transfer member 301 has a function of electrically connecting the LED 21 and the circuit board 323, and hence serves both as a heat transfer member and a connector The elastic body 311 is substantially plate-shaped, and is larger than the LED 21. The elastic body 311 includes an elastic main body 311a, and pressure contact portions 311c. The elastic main body 311a is disposed between the LED 21 and the circuit board 323. The pressure contact portions 311c are continuous with opposite sides of the elastic main body 311a, i.e. integrally formed with the elastic main body 311a, and are brought into pressure contact with associated inner wall surfaces of the metal case 307.

The film 313 is affixed to an upper surface to a lower surface of the elastic main body 311a. The heat conduction metal thin film 312, which is belt-shaped, is formed on the film 313. The heat conduction metal thin film 312 has a width slightly smaller than that of the heat dissipating section 21c of the LED 21. The heat conduction metal thin film 312 has one thereof brought into contact with the heat dissipating section 21c of the LED 21, and the other end thereof brought into contact with the fin 372 of the metal case 307.

The two electric conduction metal thin films (electric conduction metal films) 303 and 303', which are belt-shaped, are formed on the film 313 (see FIG. 3A). The electric conduction metal thin films 303 and 303' are located on opposite sides of the heat conduction metal thin film 312. The electric conduction metal thin film 303 is brought into contact with the terminal section 21d of the LED 21 and the pad 323b of the circuit board 323 to electrically connect between the terminal 21d and the pad 323b. The electric conduction metal thin film 303' is brought into contact with the terminal section 21d of the LED 21 and the other end of a conductor pattern 323c of the circuit board 323 to electrically connect between the terminal section 21d and the conductor pattern 323c.

Next, a description will be given of how the heat transfer member 301 is used.

To dispose the heat transfer member 301 between the LED 21 and the circuit board 323, the metal case 307 is fixed on the circuit board 223, beforehand.

First, the heat transfer member 301 is inserted into the metal case 307. At this time, since the pressure contact portions 311c are brought into pressure contact with inner wall surfaces of the metal case 307, the heat transfer member 301 is prevented from being wobbly in the metal case 307.

Next, the LED 21 is inserted into the metal case 307, and the locking lugs 21e of the LED 21 are inserted into the locking holes 371a of the metal case 307 to fix the LED 21 in the metal case 307.

At this time, the elastic main body 311a is sandwiched between the LED 21 and the circuit board 323, an is compressed to be elastically deformed.

The electric conduction metal thin film 303 has one end and the other end thereof pressed against the terminal section 21d of the LED 21 and the pad 323b of the circuit board 323, respectively, by the elastic force of the elastic main body 311a. The electric conduction metal thin film 303' has one end and the other end thereof pressed against the terminal section 21d of the LED 21 and the pad 323c of the circuit board 323, respectively. Further, the heat conduction metal thin film 312 has one end thereof pressed against the heat dissipating section 21c, and the other end thereof pressed against the pad 323c of the circuit board 323 via the fin 372.

As a result, the electric conduction metal thin films 303 and 303' electrically connect the LED 21 and the circuit board 323. Further, the heat conduction metal thin film 312 transfers the heat generated in the LED 21 to the case body 371 via the fin 372, and also to the conductor pattern via the fin 372 and the pad 323c of the circuit board 323, for heat dissipation.

According to the third embodiment, the same advantageous effects as provided by the first and the second embodiments are obtained, and with the provision of the metal case 307, it is possible to more stably hold the LED 21 and the heat transfer member 301.

As a variation of the third embodiment, a heat transfer member can be envisaged in which the heat generated in the LED 21 is transferred to either the case body 371 or the conductor pattern 323c.

Figure 4A:
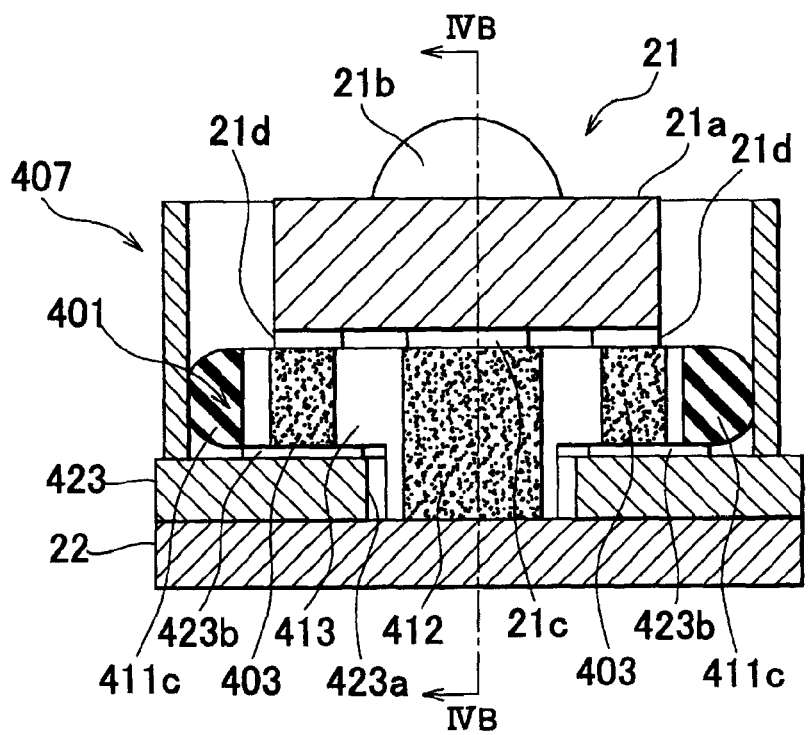
FIG. 4A is a cross-sectional view, taken on line IVA-IVA of FIG. 4B, of a heat transfer member according to a fourth embodiment of the present invention in a state of use.
Figure 4B:
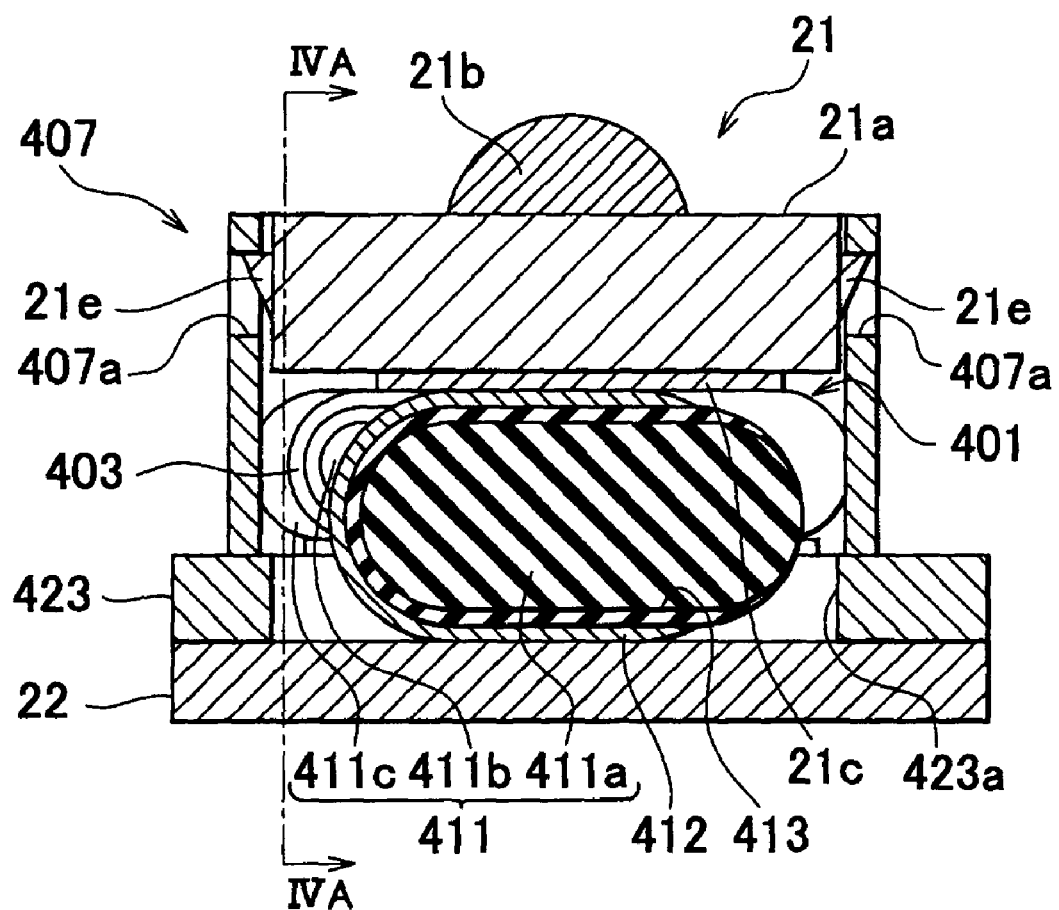
FIG. 4B is a cross-sectional view taken on line IVB-IVB of FIG. 4A.
Figure 5A:
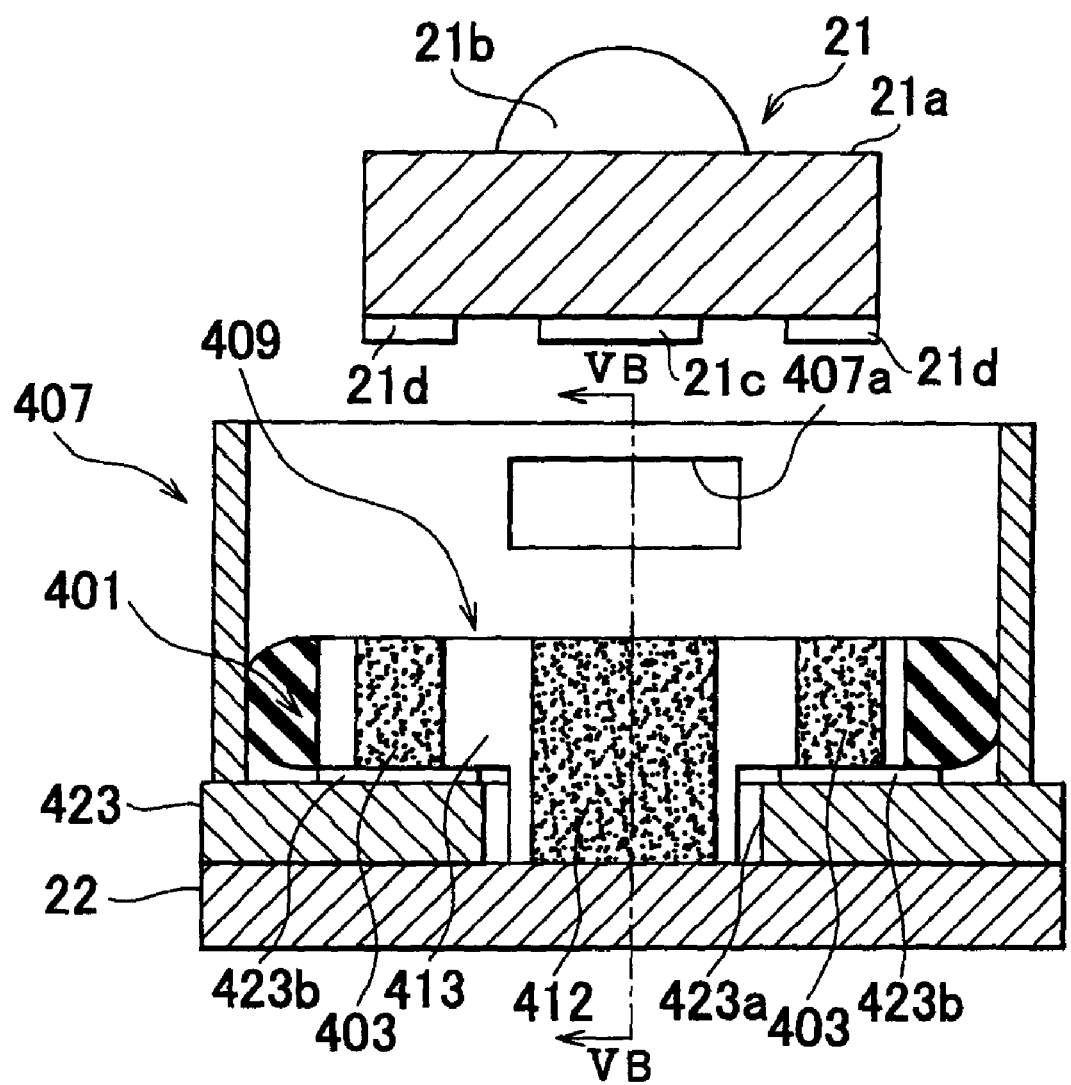
FIG. 5A is a cross-sectional view, taken on line VA-VA of FIG. 5B, of a state in which an LED is removed from a metal case appearing in FIG. 4A.
Figure 5B:
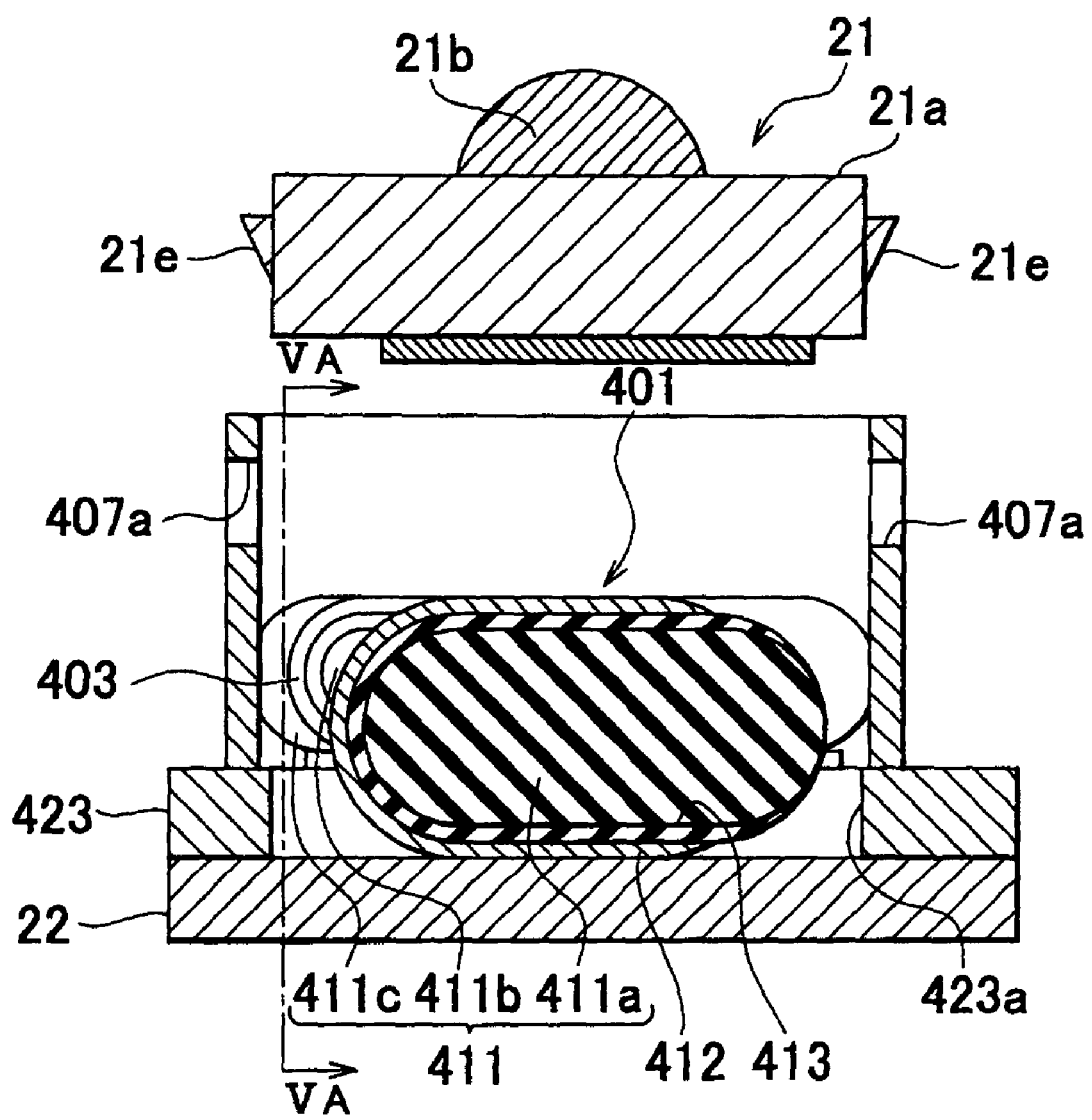
FIG. 5B is a cross-sectional view taken on line VB-VB of FIG. 5A.
Figure 6A:
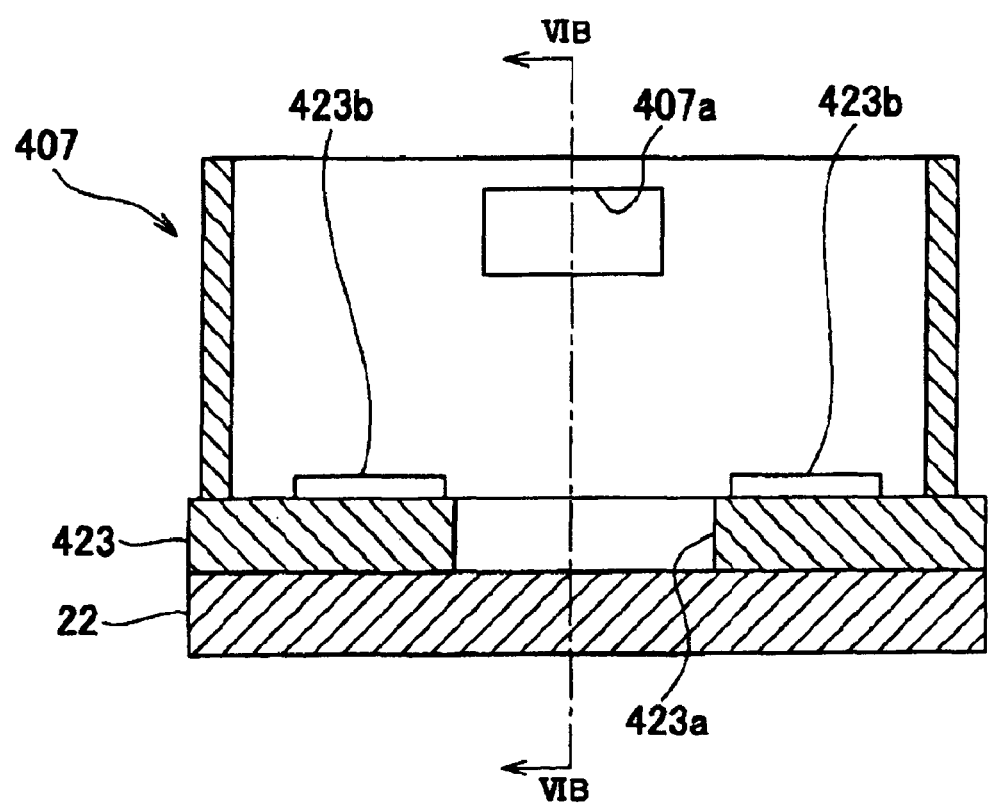
FIG. 6A is a cross-sectional view, taken on line VIA-VIA of FIG. 6B, of a state in which the heat transfer member and the LED are removed from the metal case appearing in FIG. 4A.
Figure 6B:
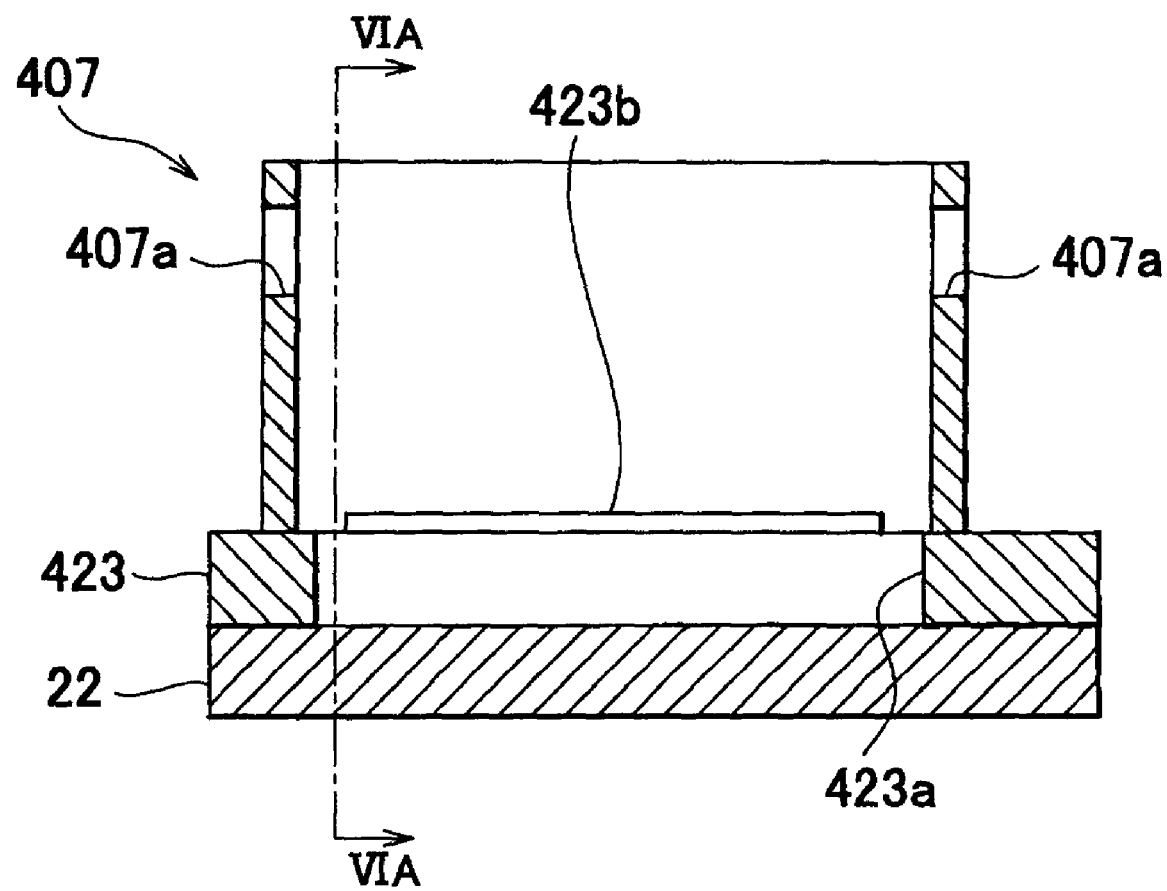
FIG. 6B is a cross-sectional view taken on line VIB-VIB of FIG. 6A.

FIG. 4A is a cross-sectional view, taken on line IVA-IVA of FIG. 4B, of a heat transfer member according to a fourth embodiment of the present invention in a state of use. FIG. 4B is a cross-sectional view taken on line IVB-IVB of FIG. 4A. FIG. 5A is a cross-sectional view, taken on line VA-VA of FIG. 5B, of a state in which an LED is removed from a metal case appearing in FIG. 4A. FIG. 5B is a cross-sectional view taken on line VB-VB of FIG. 5A. FIG. 6A is a cross-sectional view, taken on line VIA-VIA of FIG. 6B, of a state in which the heat transfer member and the LED are removed from a metal case in FIG. 4A. FIG. 6B is a cross-sectional view taken on line VIB-VIB of FIG. 6A.

Component parts identical to those of the according to the first and third embodiments are designated by identical reference numerals, and detailed description thereof is omitted, while only main component parts different in construction from those of the first and third embodiments will be described hereinafter.

As distinct from the third embodiment which employs the arrangement for transferring the heat generated in the LED 21 to the metal case 307 and the conductor pattern, the fourth embodiment employs the arrangement for transferring the heat generated in the LED 21 to the heat sink 22.

As shown in FIGS. 4A, 4B, 5A, and 5B, a circuit board 423 has a through hole 423a formed through a central part thereof. The circuit board 423 has pad 423bs formed on an upper surface thereof. The pads 423b are located in the vicinity of the through hole 423a.

As shown in FIGS. 6A and 6B, a metal case 407 has no fin. The metal case 407 is square prism-shaped, and has locking holes 407a formed through opposite sides thereof. Locking holes 407a receive locking lugs 21a of the LED 21, whereby the LED 21 is held within the case body 407.

As shown in FIGS. 4A, 4B, 5A, and 5B, a heat transfer member 401 includes an elastic body 411, a heat conduction metal thin film 412, electric conduction metal thin films 403, and a film 413. The heat transfer member 401 has a function of electrically connecting the LED 21 and the circuit board 423, and hence, the heat transfer member 401 serves both as a heat transfer member and a connector.

The elastic body 411 is larger than the LED 21, and includes an elastic main body 411a, tabs 411b, and pressure contact portions 411c (see FIGS. 4B and 5B). The elastic main body 411a is located between the LED 21 and the heat sink 22 and has larger thickness than those of the tab 411b and the pressure contact portion 411c. The tabs 411b are continuous with the opposite sides of the elastic main body 411a, i.e. integrally formed with the elastic main body 411a, and are located between the LED 21 and the circuit board 423. The pressure contact portions 411c are continuous with, i.e. integrally formed with the associated tabs 411b and are brought into pressure contact with inner wall surfaces of the metal case 407.

The film 413 is affixed to upper surfaces to lower surfaces of the elastic main body 411a and the tabs 411b. The heat conduction metal thin film 412, which is belt-shaped, is formed on the film 413. Width of the heat conduction metal thin film 412 is slightly larger than width of the heat dissipating section 21c of the LED 21. One end of the heat conduction metal thin film 412 is brought into contact with the heat dissipating section 21c of the LED 21, and the other end is brought into contact with the heat sink 22.

The two electric conduction metal thin films (electric conduction metal films) 403, which are belt-shaped, are formed On the film 413. The electric conduction metal thin films 403 are located on opposite sides of the heat conduction metal thin film 412. The electric conduction metal thin films 403 are each brought into contact with the associated terminal section 21d of the LED 21 and the associated pad 423b of the circuit board 423, to thereby electrically connect the terminal section 21d and the pad 423b.

Next, a description will be given of how the heat transfer member 401 is used.

To dispose the heat transfer member 401 between the LED 21 and the circuit board 423, the metal case 407 is fixed on the circuit board 423, beforehand.

First, the heat transfer member 401 is inserted into the metal case 407. At this time, since the pressure contact portions 411c of the heat transfer member 401 are brought into pressure contact with the inner wall surfaces of the metal case 407, the heat transfer member 401 is prevented from being wobbly in the metal case 407. Further, the lower half portion of the elastic main body 411a of the elastic body 411 is inserted into the through hole 423a of the circuit board 423.

Next, the LED 21 is inserted into the metal case 407, and the locking lugs 21e of the LED 21 are inserted into locking holes 471a of the metal case 407 to thereby fix the LED 21 in the metal case 407.

At this time, the elastic main body 411a is sandwiched between the LED 21 and the heat sink 22, and is compressed, and the tabs 411b are sandwiched between the LED 21 and the circuit board 423 and are compressed, whereby the elastic main body 411a and the tabs 411b are elastically deformed.

The heat conduction metal thin film 412 has one end and the other end thereof pressed against the heat dissipating section 21c of the LED 21 and the heat sink 22, respectively, by the elastic force of the elastic main body 411a.

Further, each metal thin film for heat conduction 403 has one end and the other end thereof pressed against the associated terminal section 21d of the LED 21 and the associated pad 423b of the circuit board 423, respectively, by the elastic force of the associated tab 411b.

As a result, the electric conduction metal thin films 403 electrically connect the LED 21 and the circuit board 423, and the heat conduction metal thin film 412 transfers the heat generated in the LED 21 to the heat sink 22

According to the fourth embodiment, the same advantageous effects as provided by the third embodiment are obtained.

As a variation of the fourth embodiment, a heat transfer member is envisaged in which the metal case 407 is replaced by a case made of a material having a low heat conductivity (e.g. a ceramic material).

According to the variation, it is possible to transfer the heat generated in the LED 21 to the heat sink 22 in a concentrated manner.

It should be noted that although in the above-described embodiments, the heat conduction metal thin films 12, 212, 312, and 412 are each formed on the films 13, 213, 313, and 413 affixed to the elastic bodies 11, 211, 311, and 411, respectively, as the heat conduction metal film, the heat conduction metal film is not necessarily required to be a thin film, but it may be a thick film.

Further, the heat conduction metal thin film may be formed directly on the elastic body.

It should be noted that although in the above-described embodiments, the electric conduction metal thin films 203, 303, and 403 are each formed on the films 213, 313, and 413 affixed to the elastic bodies 211, 311, and 411, respectively, as the electric conduction metal film, the electric conduction metal film is not necessarily required to be a thin film, and it may be a thick film or may be foil-shaped.

Further, the heat conduction metal film may be formed directly on the elastic body.

According to the above-described embodiments, each of the films 13, 213, 313, and 413 having the heat conduction metal thin film formed thereon does not cover the whole periphery of the associated one of the elastic bodies 11 211, 311, and 411, as shown in the drawings, so as to make the elastic body easy to be deformed.

It should be noted that although the heat transfer members 1, 201, 301, and 401 according to the above-described embodiments are intended to perform heat conduction of the LED, the scope of application of the present invention is not limited to the LED, but the present invention may be applied to other electronic components such as a surface-mount type LSIs.

It is further understood by those skilled in the art that the foregoing are the preferred embodiments of the present invention, and that various changes and modification may be made thereto without departing from the spirit and scope thereof.

What is claimed is:

1. A connector comprising:
a heat transfer member including:
   an elastic body that is disposed between an electronic component and a heat dissipation member, and
   a heat conduction metal film that is formed on said elastic body, for transferring heat generated in the electronic component to the heat dissipation member; and
an electric conduction metal film that electrically connects a terminal section of the electronic component and a pad of a substrate;
wherein the heat dissipation member comprises a metal case that accommodates the electronic component.

* * * * *